United States Patent [19]

Butler et al.

[11] 4,196,402

[45] Apr. 1, 1980

[54] HIGHER POWER SEMICONDUCTOR RADIATING MIRROR LASER

[75] Inventors: Jack F. Butler; Kenneth W. Nill, both of Lexington, Mass.

[73] Assignee: Laser Analytics, Inc., Bedford, Mass.

[21] Appl. No.: 772,325

[22] Filed: Feb. 25, 1977

[51] Int. Cl.[2] .............................................. H01S 3/18
[52] U.S. Cl. ......................... 331/94.5 C; 331/94.5 H; 331/94.5 P
[58] Field of Search ...................... 331/94.5 H, 94.5 C, 331/94.5 P, 94.5 F; 357/16, 17, 18

[56] References Cited

U.S. PATENT DOCUMENTS 3,794,844    2/1974    Dimmock et al. .......... 331/94.5 HX

OTHER PUBLICATIONS

Bogdankevich et al, "Semiconductor Electron-Beam-Pumped Lasers of the Radiating Mirror Type," IEEE Journal of Quantum Electronics, vol. QE-9, No. 2, Feb. 1973, pp. 342-347.

C. Fonstad, "High Power, Beam Pumped Radiating Mirror Geometry (Pb,Sn) Te Lasers at 16 μm for Isotope Separation" MIT Research in Materials Annual Report, Jan. 1977, pp. 75-76.

M. B. Parish, "Heterostructure Injection Lasers" IEEE Transactions on Microwave Theory and Techniques, vol. MTT-23, No. 1, Jan. 1975, pp. 20-30.

S. H. Groves et al, "Double Heterostructure $Pb_{1-x}Sn_xTe-PbTe$ Lasers with cw Operation at 77K," Applied Physics Letters, vol. 25, No. 6, Sep. 15, 1974, pp. 331-333.

Primary Examiner—James W. Davie
Attorney, Agent, or Firm—Cesari & McKenna

[57] ABSTRACT

Radiating mirror lasers in which a semiconductor active element containing an appropriately fabricated heterostructure configuration is formed as one end mirror of a two-mirror resonant cavity. The active element is fabricated from an alloy semiconductor compound such a lead salt alloy, the bandgap of which may be varied by varying the relative composition of its constituents. By properly selecting the compound and its composition, lasers may be made for operation at wavelengths that span the ultraviolet, visible and infrared portions of the spectrum. The lasers combine the inherently high power characteristics of a radiating mirror structure with a wide spectral coverage. Arrangements are disclosed for increasing power efficiencies, for tuning the operating wavelength over a wide range and for otherwise improving the utility of the lasers.

20 Claims, 4 Drawing Figures

HIGHER POWER SEMICONDUCTOR RADIATING MIRROR LASER

BACKGROUND OF THE INVENTION

This invention relates generally to lasers and, more particularly, to semiconductor lasers adapted for producing high power laser radiation at any selectable wavelength within a wide spectral range.

There is a growing need in many areas of science, technology, industry and government for lasers capable of providing high power outputs in the kilowatt range and higher at any desired wavelength from the ultraviolet to the far infrared regions of the electromagnetic spectrum. Lasers of this type would find application in several diverse fields including, for example, communications, holography, spectroscopy and isotope separation. Many potentially important programs and projects in these and other fields rely for their eventual success upon the development of high power lasers operating in spectral regions where no such lasers presently operate. For example, in the laser separation of isotopes of uranium, there is a need for a high power, precisely tuned source at a wavelength of 16 micrometers in the infrared. Although various laser systems have been proposed for operation at this wavelength (see, for example, the article by Robert L. Byer in IEEE Journal of Quantum Electronics, November 1976, pages 732 and 733), none of these systems has to date been realized in a practical embodiment.

Traditionally, users choosing from available lasers have had to make trade-offs between high output power and wide spectral coverage. For example, various gas and solid-state lasers have been available that provide relatively high power outputs in the infrared and other regions of the spectrum. These lasers, however, operate either at discrete wavelengths or over relatively narrow spectral bands and, consequently, leave large gaps in important regions of the spectrum.

Many semiconductor lasers, on the other hand, have been available which provide outputs over a wide spectral band. These lasers, however, have for the most part been inherently low power devices. Near 10 micrometers, for example, a continuous wave power output of 10 milliwatts from a semiconductor laser is generally considered exceptionally high.

There has been proposed one semiconductor laser structure that has shown great promise for producing high power outputs comparable to those achieved with gas and solid-state lasers. The basic structure, which is known as an "emitting" or "radiating" mirror laser, was devised by Russian scientists and is described in the article by O. V. Bogdankevich et al in Vol. QE-9, No. 2 of the IEEE Journal of Quantum Electronics, pages 342-347 (February 1973). In a radiating mirror laser of the type described in this article, the pumped active element is fabricated so as to serve as one mirror of a two-mirror resonant cavity. Emission from the element is thus preferentially normal to the pumped surface.

The laser of the above article included an active element formed as a polished plane-parallel disk from n-type gallium arsenide (GaAs). The disk was supported on a sapphire plate in thermal contact with a source of refrigerant. A grid of grooves was cut into the pumped surface of the disk and filled with a light-absorbing material (i.e. tellurium) to segment the surface and prevent the amplification of spontaneous emission across the surface. The segmented surface of the disk was pumped by a pulsed beam of high energy electrons and output taken at a wavelength corresponding to the energy band gap of GaAs through a partially transmissive dielectric mirror spaced from the disk and forming the second reflector of the resonant cavity.

The reported power efficiencies achieved with the above laser were less than one percent. This is an extremely low efficiency for any laser and clearly demonstrates the need for continued work and improvement on the radiating mirror concept. However, in spite of this low efficiency, the reported peak power outputs achieved with the laser were in excess of 30 kilowatts in 30-50 nanosecond pulses. The great potential of the radiating mirror laser for high power operation is thus evident.

We have recognized that various improvements can be made to radiating mirror laser structures to make such structures useful over a wide spectral range rather than only at a wavelength corresponding to the bandgap of GaAs and also to increase the efficiency and, therefore, power output of such structures.

OBJECTS OF THE INVENTION

It is, therefore, a broad object of this invention to provide an improved laser useful in a wide variety of fields and applications, in many situations where no suitable laser sources presently exist.

Another object of the invention is to provide an improved semiconductor laser capable of providing high power laser radiation at any selectable wavelength within a wide spectral range.

Another object of the invention is to provide an improved semiconductor laser of the type described having an output wavelength that is precisely tunable over a wide spectral range.

Still another object of the invention is to provide a semiconductor radiating mirror laser structure of improved efficiency and spectral range.

SUMMARY OF THE INVENTION

In accordance with one feature of our invention, a semiconductor radiating mirror laser is provided in which the pumped active element is formed from an alloy compound semiconductor having a direct energy bandgap which may be varied by varying the relative composition of its constituents. Any of a wide variety of alloy compound semiconductors may be used for the active element including compounds such as lead tin selenide ($Pb_{1-x}Sn_xSe$), lead tin selenide telluride ($Pb_{1-x}Sn_x Se_yTe_{1-y}$), gallium aluminum arsenide ($Ga_{1-x}Al_xAs$), cadmium sulfide selenide ($CdS_{1-x}Se_x$) and the like. With such compounds, the bandgap of the active element may be selected to provide emission at any desired wavelength over a wide spectral range including the ultraviolet, visible and infrared regions. By using such compounds one can combine the inherently high power characteristics of a radiating mirror laser structure with a broad spectral coverage to provide lasers suitable for use in numerous diverse applications.

In accordance with another feature of the invention, the active element semiconductor of a radiating mirror laser has a heterostructure configuration including a thin active layer of a semiconductor compound of a first bandgap formed on a substrate of the same semiconductor compound but of a second, slightly greater bandgap. Heterostructures of this type can be formed in alloy semiconductor compounds by a variety of well-established crystal growth tecnhiques including liquid phase epitaxy, molecular beam epitaxy and compositional interdiffusion. The heterostructure configuration advantageously confines the inverted population of charge carriers and the laser radiation induced by the pump within the narrow bandgap active layer of the element. Both of these effects lead to increased efficiency and lower thresholds and allow operation at higher temperatures. Moreover, the thickness of the narrow bandgap active layer can be selected so that it absorbs essentially all of the incident pump energy. Without the heterostructure configuration, a considerable amount of the pump energy would be dissipated as heat within the active element. Heating of the active element has deleterious effects on the efficiency of the laser.

In accordance with still another feature of the invention, a transverse heterostructure configuration is utilized to form an optically lossy grid at a major, radiation emitting surface of the active element of a semiconductor radiating mirror laser thereby to prevent amplification of emission along or parallel to emitting surface of the element but to permit emission normal to the emitting surface of the element. Specifically, the same alloy semiconductor compound that is used in forming the active layer of the element is used in forming the lossy grid. However, the bandgap of the compound in the grid is narrower than the bandgap of the active layer to provide the desired absorption. A transverse heterostructure grid configuration of this type may be achieved during fabrication of the active element using photolithographic tecnhiques. The entire active element including substrate, active layer and lossy grid may thus be formed as one single crystal. This reduces strains and otherwise improves the quality of the active element and thereby minimizes crystallographic and other defects that contribute to loss in the element. It also makes that active element less susceptible to damage from the pump and, thus, improves its useful life.

We have recognized that various other improvements can be made to increase the efficiency and utility of a radiating mirror laser device. For example, we have found it preferable, with most alloy semiconductor compounds, particularly when such compounds are formed in the heterostructure configurations described above, to use optical pumping instead of electron beam pumping. Electron beam pumping in itself is not an efficient excitation process since a large fraction of electrons in the beam penetrate through the active layer to the substrate where their energy is dissipated as heat. With an optical pump, on the other hand, the active element can be designed so that essentially all of the pump energy is absorbed within the narrow bandgap active layer of the element. This not only reduces heating of the active element, but also increases the inverted population of charge carriers in the active layer which eventually combine radiatively. Both of these factors lead to higher overall efficiencies.

We have also found it desirable to fabricate the semiconductor active element in a radiating mirror laser so that the element itself exhibits an inherently high reflectance to the pump energy and also to the laser radiation emitted by the element. Essentially metallic reflectances can be achieved in the heterostructure configurations described above by selecting a sufficiently high carrier concentration for the substrate that the free carrier plasma frequency therein is less than the frequency of the pump energy. Such a high reflectance active element does not generally require dielectric mirror coatings and also assists in confining the pump energy and laser radiation within the narrow bandgap active layer of the element.

Additionally, many high power laser applications require output beams of very narrow bandwidth. Bandwidth narrowing can be achieved in a radiating mirror laser by incorporating a mode selection device such as a tilted etalon or a grating within the cavity of the laser. The mode selection device restricts laser oscillations within the cavity to a narrow spectral region and thereby narrows the bandwidth of the output of the laser. The mode selection device can also be mechanically adjusted (e.g., tilted) within the cavity to tune the wavelength output of the laser.

BRIEF DESCRIPTION OF THE DRAWING

The foregoing and other objects, features, and advantages of the invention will be better understood from the following detailed description taken in conjunction with the accompanying drawing in which.

Figure 1:
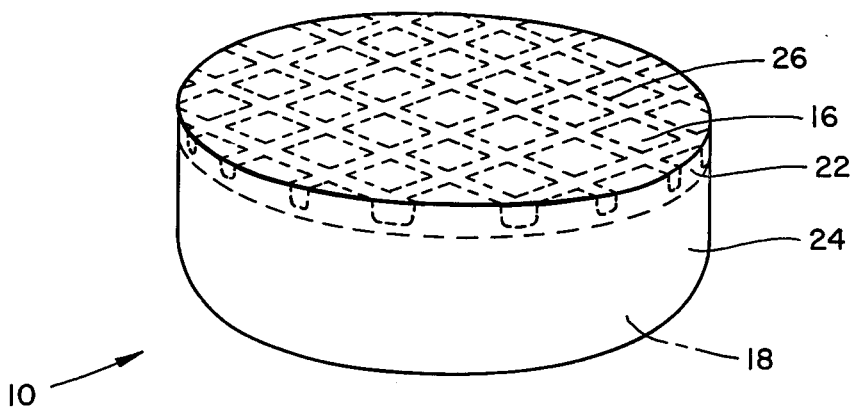
FIG. 1 is a perspective illustration of a semiconductor active element useful in a radiating mirror laser embodying the invention.

The drawing figures are not necessarily drawn to scale or to relative dimensions.

DETAILED DESCRIPTION

Referring now specifically to FIG. 1, there is shown an active element 10 of the type preferrably used in a radiating mirror laser embodying the invention. The element 10 is fabricated from an alloy semiconductor compound of the type having a direct energy bandgap that can be increased or decreased by varying the relative composition of its constituents. There are a wide variety of semiconductor compounds that exhibit this characteristic so that the particular compound selected for the element 10 will depend to a large extent upon the intended application of the laser (e.g., the wavelength of operation desired). Lead salt compounds such as $Pb_{1-x}Sn_xSe$, $Pb_{1-x}Sn_xTe$ and quaternary and higher order alloys of these compounds are considered particularly attractive for obtaining laser emission over a wide range in the infrared. Such compounds are also readily grown as high quality single crystals with excellent homogeneity by standard crystal growth methods (e.g., the Bridgman method). For purposes of illustration, the element 10 will be considered to be formed from $Pb_{1-x}Sn_xSe$.

Figure 2:
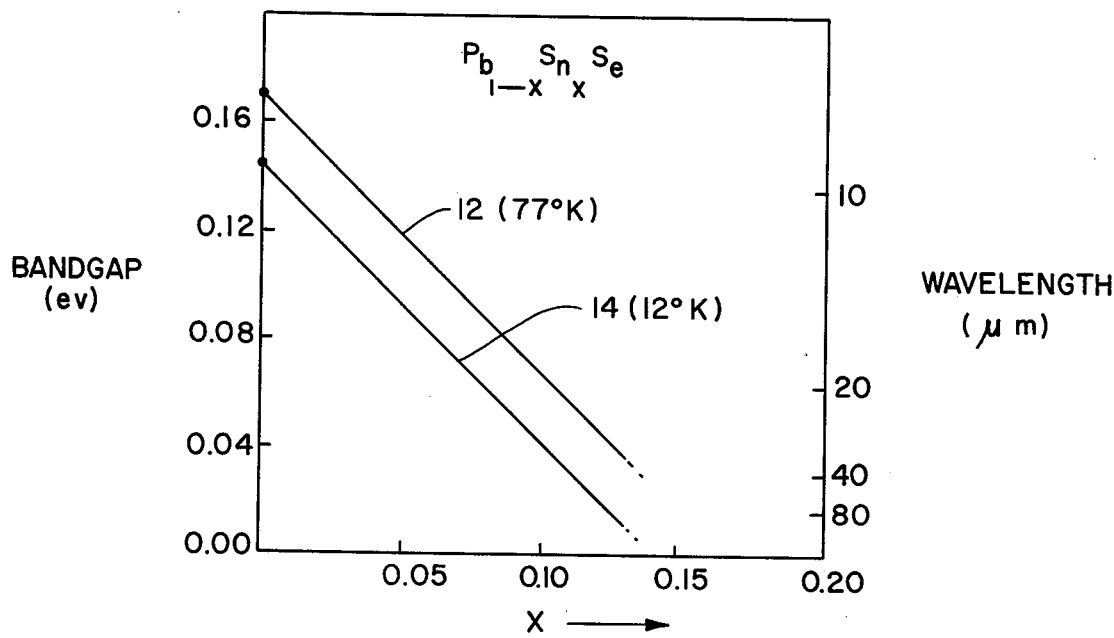
FIG. 2 is a plot of bandgap and wavelength versus x for two different temperatures and for illustrative alloy semiconductor compound $Pb_{1-x}Sn_xSe$ useful in forming the active element of FIG. 1.

FIG. 2 illustrates the variation of the bandgap of the illustrative material $Pb_{1-x}Sn_xSe$, as a function of x, the relative Sn composition. The bandgap is expressed on the left hand vertical axis in electron volts (eV). The upper curve 12 represents the behavior of the semiconductor at 77° Kelvin (K.) while the lower curve 14 represents the behavior of the semiconductor at 12° K. The wavelength of emission to which the bandgap corresponds is indicated on the right hand vertical axis in micrometers (μm).

As can be appreciated from FIG. 2, the bandgap of $Pb_{1-x}Sn_xSe$ decreases, while the wavelength increases, as x is increased. Relatively small changes in x give rise to relatively large variations in wavelength. In practice, it has been possible to grow $Pb_{1-x}Sn_xSe$ crystals of sufficient quality for lasers with x values ranging from zero to about 0.25. At 12° K., this corresponds to wavelengths of emission of about 7 μm to over 30 μm, respectively.

As indicated in FIG. 1, the element 10 illustratively has the shape of a disk with two, plane-parallel major end surfaces 16 and 18, respectively. The diameter of the element 10 may vary depending upon the size of the laser desired, but is illustratively about 1.0 centimeter (cm). The surface 16 is the pumping surface of the element 10 and also the surface from which emission is obtained.

Beneath the surface 16, there is formed a heterostructure including a relatively thin active layer 22 and a somewhat thicker substrate 24. The semiconductor compound is the same in the active layer 22 and substrate 24 (e.g., $Pb_{1-x}Sn_xSe$); however, the bandgap of the compound in the active layer 22 is preferably slightly narrower than that in the substrate 24 to provide the desired confinement of excited carriers and emission. The difference in bandgap is readily achieved by selecting different x values for the compound in the layer 22 and in the substrate 24, respectively. For example, if we assume that a laser operating at a wavelength of 15 μm is desired at an active element operating temperature of 12° K., then, from curve 14 in FIG. 2, it can be seen that the x-value of the compound in the active layer 22 would be about 0.065. The x-value of the compound in the substrate 24 would be selected somewhat less than 0.065 (e.g., 0.055) to provide a slightly greater bandgap. Excessively large differences in x-value of the compound of the substrate 24 and active layer 22 can result in lattice strains during growth of the layer 22.

The depth or thickness of the active layer 22 is preferably selected to provide optimum confinement of excited carriers and laser emission therein and also so that essentially all of an incident pumping beam (e.g., optical) is absorbed therein. Thus, the particular thickness selected for the layer 22 depends upon a number of factors including the absorption coefficient and refractive index of the material of which it is made, the operating wavelength of the laser and the wavelength and power of the pumping beam. If we assume, along with the previously specified parameters, that the element 10 is to be pumped by an optical beam at 10.6 μm having a peak power of 100 kilowatts, then a suitable thickness for the active layer 22 would be about 0.1 μm or less.

The thickness of the substrate 24 is preferably as small as possible for heat transfer reasons but mechanical considerations generally require that it be thicker than the active layer 22. A substrate thickness on the order of 1.0 mil would be practical to obtain using standard crystal growth methods and would provide reasonably good heat transfer therethrough.

As also indicated in FIG. 1, the active layer 22 is segmented by an optically lossy grid 26 to prevent the amplification of radiation that is emitted along or parallel to the surface 16 in the layer 22. The grid 26 is preferably, although not necessarily, formed in a heterostructure configuration using the same semiconductor compound as is used in the layer 22 and in the substrate 24. The band-gap of the compound in the grid 26 is made narrower than that in the layer 22 so that the grid 26 quenches the emission along the surface 16. The grid 26 may, for example, be formed from $Pb_{1-x}Sn_xSe$ having an x-value of 0.075.

The heterostructure configuration for the grid 26 is preferred because it allows the entire element 10 including the active layer 22, the substrate 24 and the grid 26 to be fabricated as one single crystal. The overall crystallographic and optical quality of the element 10 can thus be quite high which leads to higher operating efficiencies and longer element life. The grid 26, however, could also be formed by etching or cutting grooves in the active layer 22 and filling the grooves with a light absorber such as Te or Se.

Although a variety of semiconductor fabrication techniques may be used to form the element 10 of FIG. 1, liquid phase epitaxial growth techniques (LPE) are admirably suited for this purpose. The specific details of the LPE process used depend upon the particular semiconductor compound being grown. For Pb-salt alloys, the LPE process described in the article by S. Groves and K. W. Nill and A. J. Strauss in Vol. 25 of Applied Physic Letter page 331 (September 1974) is particularly well suited.

Typically, the substrate 24 of the desired x material (e.g., $Pb_{0.945}Sn_{0.055}Se$) is first grown as a single crystal and prepared using standard crystal preparation techniques. The carrier concentration of the substrate 24 is preferably selected high enough so that the free carrier plasma frequency therein is less than the frequency of the pumping radiation. The reflectance of the substrate 24 to both the pump and output laser radiation is then essentially metallic and exceeds 90 percent. This enables the element 10 to serve as one mirror in a two-mirror resonant cavity in the radiating mirror structure and generally eliminates the need for dielectric mirror coatings on the element 10. It also helps confine the pump and laser radiation within the active layer 22. Metallic reflectances are generally achievable in $Pb_{1-x}Sn_xSe$ with carrier concentrations greater than about $4 \times 10^{19}$ cm$^{-3}$. Carrier concentrations of this level are easily attainable using standard annealing and diffusion techniques.

Once the substrate 24 is prepared, the active layer 22 (e.g., $Pb_{0.935}Sn_{0.065}Se$) is grown as an expitaxial layer on one of its major surfaces. A gridded photomask may be deposited over the surface so that the epitaxial layer is preferentially grown in segments and not in the area of the grid 26. Alternatively, the active layer 22 may be grown as a continuous epitaxial layer over the substrate surface. The area of the grid 26 would then be cut into the layer 22 using photoetching techniques.

The next step in the process is to deposit or grow the optical lossy grid compound (e.g., $Pb_{0.925}Sn_{0.075}Se$) in the vacated areas of the active layer 22 to form the grid 26. If the lossy grid material is grown as an epitaxial layer, a photomask which is the complement of the gridded photomask used in growing the active layer 22 may be used so that the lossy grid material grows preferentially in the grooves. As previously noted, the grid 26 could also be formed by depositing an optical absorber like Te or Se in the grooves.

The element 10 is then mechanically and chemically polished in preparation for mounting in a radiating mirror laser.

Figure 3:
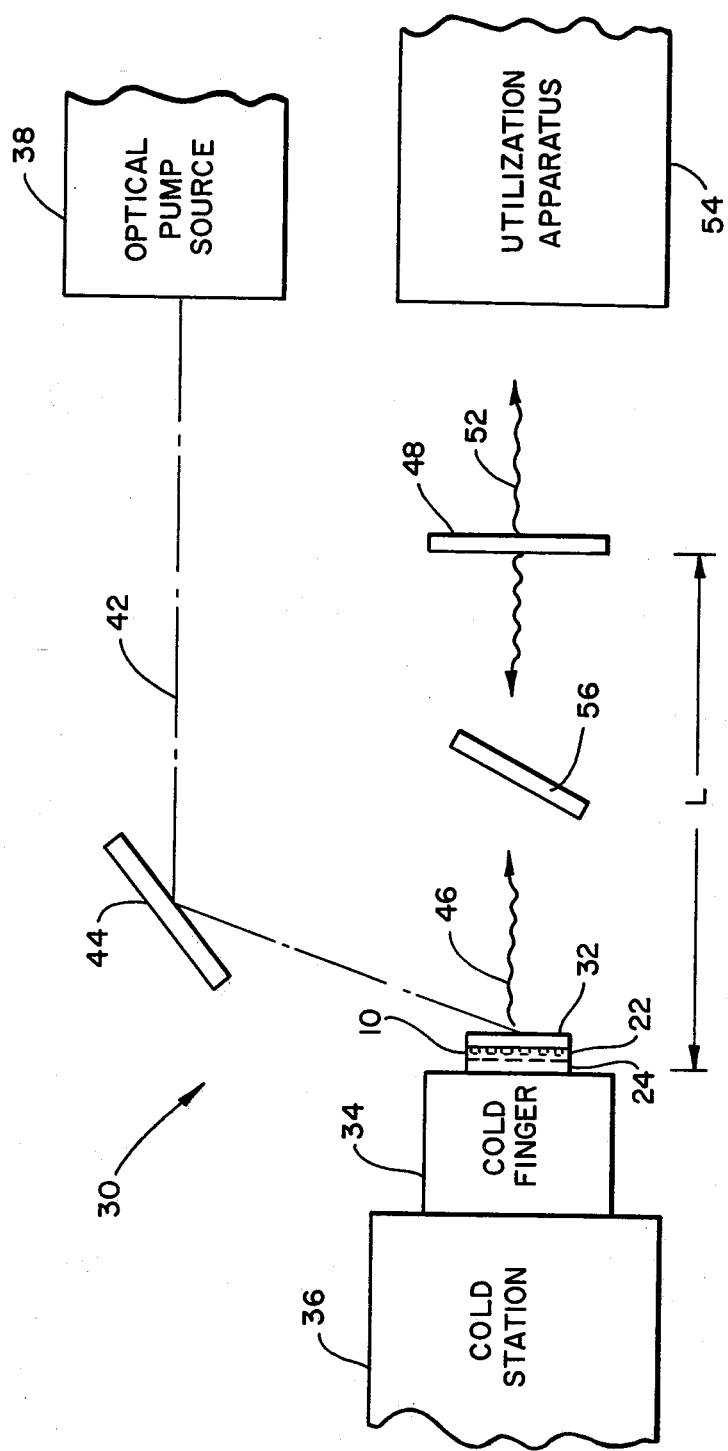
FIG. 3 is a partially schematic, partially block diagrammatic illustration of a radiating mirror laser embodying the invention.

FIG. 3 of the drawing illustrates the basic components of a radiating mirror laser 30 embodying the invention and utilizing the active element 10 described above. As indicated in FIG. 3, the pump surface of the element 10 (i.e., the surface 16 in FIG. 1) is coated with an antireflection coating 32. The coating 32 may, for example, be formed of arsenic trisulphide which is evaporated onto the pump surface 16.

The opposite surface of the element 10 (i.e., the surface 19 in FIG. 1) is mounted to a cold finger 34 which is preferably formed of a metal such as high purity aluminum providing a good thermal expansion match with the semiconductor of the element 10. The mounting may be accomplished using cold indium bonding or a thermally conductive epoxy. The cold finger 34 is, in turn, in thermal communication with a cold station 36 through which a refrigerant is circulated to maintain the finger 34 and the element 10 at a controllably low operating temperature (e.g., 12° K.).

The element 10 is pumped by an optical pumping source 38 which in this particular embodiment is illustratively a pulsed $CO_2$ gas laser providing a pump beam 42 at 10.6 $\mu$m. The pump beam 42 is directed by a mirror 44 or other optics so that it is incident on the pump surface of the element 10 at Brewster's angle. Emission from the element 10 occurs essentially normal to the pump surface as indicated by the arrow 46.

In the laser 30, the element 10 itself serves as one mirror of a resonant cavity. A second mirror 48 is spaced a distance L away of the element 10 and serves as the second mirror of the cavity. The radiation emitted by the element 10 thus continuously oscillates and is stimulated within the cavity defined by the element 10 and the mirror 48. The mirror 48 is made partially transmissive to the laser radiation so that a portion of the radiation is extracted thereby as an output beam 52 for use in a utilization apparatus 54. In this particular embodiment, the output beam 52 is concentrated about a wavelength of 15 $\mu$m.

The bandwidth of the output beam 52 may be narrowed by incorporating a mode selection device within the laser cavity. In FIG. 3, a mode selection device in the form of a tilted etalon 56 is shown disposed with the cavity of the laser 30. The etalon 56, which is illustratively of the type described in the article by M. Hercher in Vol. 8, No. 6 of Applied Optics, pages 1103–1106 (June 1969), restricts the laser oscillations within the cavity to a relatively narrow band and thus narrows the bandwidth of the output beam 52. The etalon 56 can also be mechanically adjusted within the laser 30, for example, by tilting or rotating the etalon, to tune the wavelength of the output beam 52.

The wavelength of the output beam 52 from the laser 30 may be tuned in other ways. For example, from curves 12 and 14 in FIG. 2, it may be noted that when the x-value of the semiconductor compound is fixed, the bandgap of the compound may be varied over a relatively wide range by varying the temperature of the compound. Consequently, the wavelength of operation of the laser 30 may be controlled by controlling the temperature of the element 10. For this reason, the cold station 36 of FIG. 3 is preferably precisely controllable to vary the temperature of the element 10 and thus the wavelength of the output beam 52 emitted from the laser 30.

Figure 4:
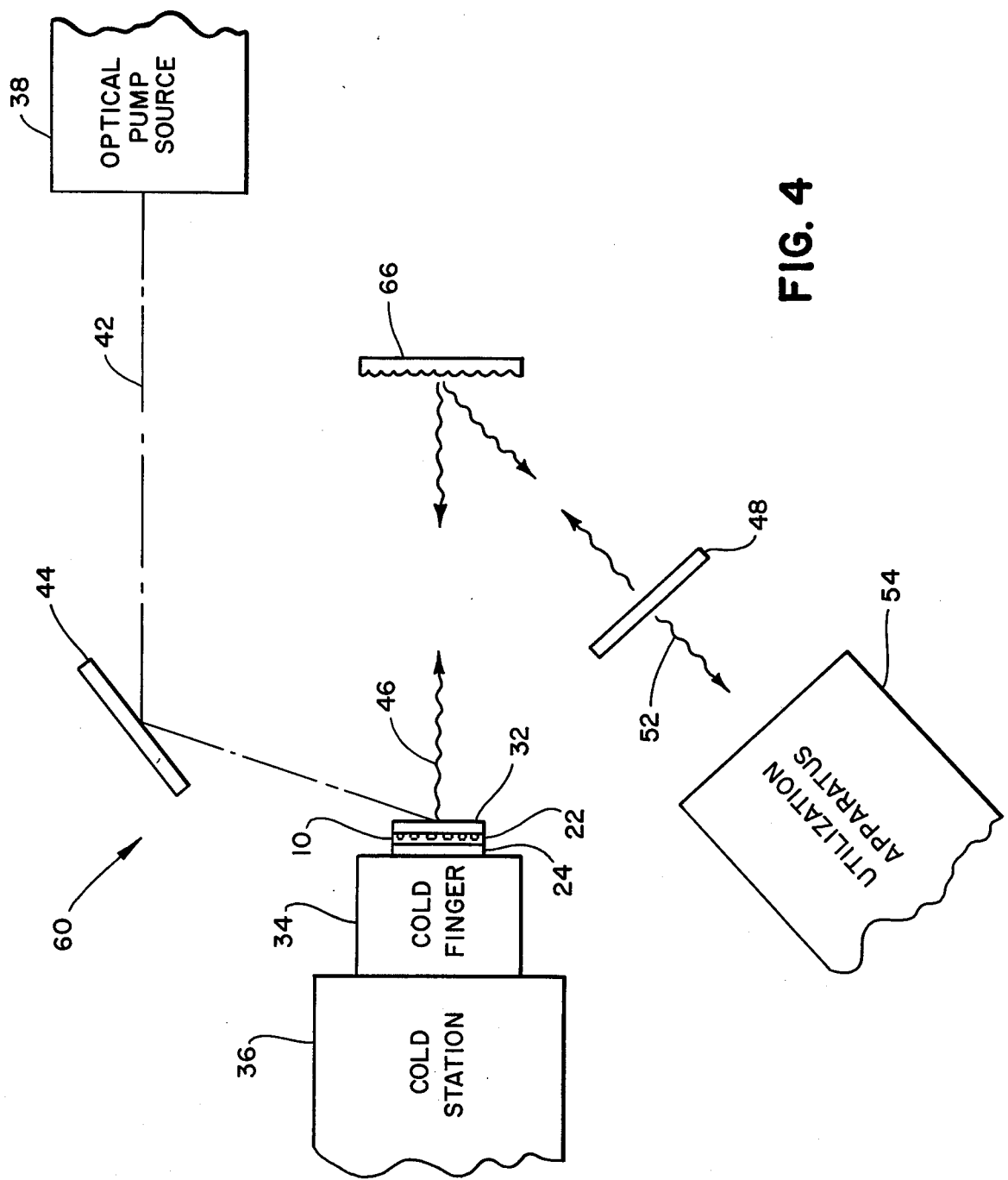
FIG. 4 is a partially schematic, partially block diagrammatic illustration of a modified radiating mirror laser embodying the invention.

FIG. 4 illustrates a modified radiating mirror laser 60 embodying the invention in which the mode selection device is in the form of an optical grating 66. The grating 66 may, for example, be of the type described in the article by R. McClellan and F. Denton in the July/August 1968 edition of Optical Spectra. The remaining components of the laser 60 are illustratively identical to the corresponding components of the laser 30 of FIG. 3 and are thus referenced identically. It is noted however, that because of the manner in which the laser radiation is reflected from the grating 66, the cavity is, in effect, branched and the output mirror 38 and utilization apparatus 54 are angularly positioned to receive the radiation reflected from the grating 66.

The grating 66, like the etalon 56 of FIG. 3, serves to restrict the oscillations with the cavity of the laser 60 to a relatively narrow band and thereby narrows the bandwidth of the output beam 52. The grating 66 can also be tilted or rotated within the cavity to tune the wavelength of the beam 52.

Our preliminary theoretical and experimental investigations of the radiating mirror structure and of various alloy semiconductor compounds useful therein indicate that lasers of the above described type will routinely produce more than 10 kilowatts of peak power in 100 nanosecond pulses with a frequency of $10^4$ pulses per second. This corresponds to more than one millijoule or $7.7 \times 10^{16}$ photons per pulse at a 0.1 percent duty cycle and represents an exceptionally high power performance for semicondutor lasers. The powers ultimately achievable with the lasers are expected to be even higher, i.e., tens of kilowatts and more.

Additionally, because of the exceptionally large variety of variable bandgap semiconductor compounds available for use in the lasers, the output wavelengths of the lasers will braodly span the electromagnetic spectrum. With Pb-salt alloys alone, the lasers will allow the selection of any wavelength from less than about 3 $\mu$m to more than 30 $\mu$m in the infrared. In addition to Pb-salt alloys, $Ga_{1-x}Al_xAs$ and $CdS_{1-x}Se_x$ and various quaternary or higher order alloys will provide spectral coverage in the visible and ultraviolet regions. Numerous other compounds and alloys selected from Groups III–V, III–VI, IV–VI and II–VI of the periodic table are contemplated as within the scope of our invention.

It should be understood that the above described embodiments are illustrative only and that numerous modifications can be made thereto without departing from the scope of our invention. For example, optical pumping sources other than the pulsed $CO_2$ laser mentioned above may be used to excite the lasers. A $CO_2$ laser is considered preferably as a pump source in those embodiments in which the selected output wavelength is greater than about 9 $\mu$m. A pulsed hydrogen fluoride (HF) laser may be preferably for wavelengths from 5 $\mu$m to 9 $\mu$m, while a ruby laser may be preferable in the visible and near infrared. If continuous wave rather than pulsed output is desired, then a continuous wave pump source may be used. Additionally, despite its inherent inefficiency, electron beam pumping of the active element may be preferred in certain embodiments, such as those operating in the ultraviolet.

Also, in addition to liquid phase epitaxy, other crystal growth techniques such as molecular beam epitaxy and compositional interdiffusion may be used to fabricate the active element 10.

It is thus the object of the appended claims to cover these and other modifications as come within the true spirit and scope of the invention.

What we claim as new and desire to secure by Letters Patent is:

1. A semiconductor radiating mirror laser comprising a heterostructure active element including a first and a second major surface, an active layer defining said first surface and a substrate integral with said active layer and defining said second surface, said active layer being formed of a semiconductor compound having a first energy bandgap, said substrate being formed of a semiconductor compound having a second energy bandgap greater than said first energy bandgap, means for pumping said active layer with a pump beam incident upon said first surface to enable the emission of radiation from said active layer at a wavelength corresponding to said first bandgap, and reflective means spaced from said first surface of said active element and defining with said active element a resonant cavity for said radiation that is emitted essentially normal to said first surface, a portion of said radiation being extracted from said cavity as an output beam from said laser.

2. A laser as recited in claim 1 in which the semiconductor compound of said active layer and said substrate comprise an alloy semiconductor compound having an energy bandgap that is variable by varying the relative composition of its constituents.

3. A laser as recited in claim 2 in which said alloy semiconductor compound comprises a lead-salt alloy.

4. A laser as recited in claim 2 in which said alloy semiconductor compound is selected from the group of compounds consisting of $Pb_{1-x}Sn_xSe$, $Pb_{1-x}Sn_xTe$, $Ga_{1-x}Al_xAs$, $CdS_{1-x}Se_x$ and quaternary and higher order alloys of these compounds.

5. A laser as recited in claim 1 in which said pumping means comprises an optical beam pumping source.

6. A laser as recited in claim 1 further including mode selection means disposed between said first surface of said active layer and said reflective means and within said resonant cavity for restricting said radiation to a narrow bandwidth.

7. A laser as recited in claim 6 in which said mode selection means is adjustable within said resonant cavity to tune the bandwidth of said radiation.

8. A laser as recited in claim 1 in which the alloy semiconductor compound of said substrate has a carrier concentration of a sufficiently high level that the reflectance of said substrate to said pump beam and said radiation is essentially metallic.

9. A laser as recited in claim 1 in which said active layer includes at said first surface a grid of material that is absorptive to said radiation to suppress amplification of said radiation that is emitted by said active layer along said first surface.

10. A laser as recited in claim 9 in which said grid is formed of the same semiconductor compound as said active layer but having a third energy bandgap that is narrower that said first bandgap.

11. A semiconductor radiating mirror laser comprising a heterostructure active element including at least one major surface and a grid of optically absorptive material formed within said active element at said surface, said active element being formed of a semiconductor compound having a first energy bandgap, said grid being formed of the same semiconductor compound as said active element but having a second energy bandgap that is narrower than said first bandgap, means for pumping said active element with a pump beam incident upon said surface to enable the emission of radiation from said active element at a wavelength corresponding to said first bandgap, and reflective means spaced from said surface of said active element and defining with said active element a resonant cavity for said radiation that is emitted essentially normal to said surface, a portion of said radiation being extracted from said cavity as an output beam from said laser, said grid being absorptive to said radiation to suppress amplification of said radiation that is emitted along said surface.

12. A lase as recited in claim 11 in which the semiconductor compounds of said active element and said grid comprise an alloy semiconductor compound having an energy bandgap that is variable by varying the relative composition of its constituents.

13. A laser as recited in claim 12 in which said alloy semiconductor compound comprises a lead-salt alloy.

14. A laser as recited in claim 12 in which said alloy semiconductor compound is selected from the group of compounds consisting of $Pb_{1-x}Sn_xSe$, $Pb_{1-x}Sn_xTe$, $Ga_{1-x}Al_xAs$, $CdS_{1-x}Se_x$ and quaternary and higher order alloys of these compounds.

15. A laser as recited in claim 11 in which said active element further includes an active layer defining said surface and in which said grid is formed and a substrate integral with said active layer, and in which said active layer, said substrate and said grid are formed of one and the same alloy semiconductor compound but having differing energy bandgaps, the bandgap of said substrate being greater than the bandgap of said active layer, and the bandgap of said grid being narrower than the bandgap of said active layer.

16. A laser as recited in claim 11 in which said pumping means comprises an optical beam pumping source.

17. A laser as recited in claim 11 further including mode selection means disposed between said surface of said active element and said reflective means and within said resonant cavity for restricting said radiation to a narrow bandwidth.

18. A laser as recited in claim 17 in which said mode selection means is adjustable within said resonant cavity to tune the bandwidth of said radiation.

19. A laser as recited in claim 15 in which the alloy semiconductor compound of said substrate has a carrier concentration of a sufficiently high level that the reflectance of said substrate to said pump beam and said radiation is essentially metallic.

20. A semiconductor radiating mirror laser comprising an active element including a first and a second major surface, an active layer defining said first surface, a substrate integral with said active layer and defining said second surface and a grid of optically absorptive material formed within said active layer at said first surface, said active layer, said substrate and said grid being formed of one and the same alloy semiconductor compound but having differing energy bandgaps, the bandgap of said substrate being greater than the bandgap of said active layer, the bandgap of said grid being narrower than the bandgap of said active layer, means for pumping said active element with a pump beam incident upon said first surface to enable the emission of radiation from said active layer at a wavelength corresponding to the bandgap of said active layer, and reflective means spaced from said first surface of said active element and defining with said active element a resonant cavity for said radiation that is emitted essentially normal to said first surface, a portion of said radiation being extracted from said cavity as an output beam from said laser.

* * * * *